United States Patent [19]
Abe

[11] Patent Number: 5,857,004
[45] Date of Patent: Jan. 5, 1999

[54] DIGITAL DATA RECEIVER

[75] Inventor: Shuji Abe, Saitama-ken, Japan

[73] Assignee: Kabushiki Kaisha Toshiba, Kawasaki, Japan

[21] Appl. No.: 400,099

[22] Filed: Mar. 6, 1995

[30]    Foreign Application Priority Data

Mar. 4, 1994  [JP]  Japan ................................. 6-034613

[51] Int. Cl.$^6$ ................................................. H04L 27/06
[52] U.S. Cl. ................... 375/344; 455/189.1; 455/190.1;
455/192.2; 455/207; 455/209; 455/255;
455/316; 455/323; 348/731; 348/735
[58] Field of Search .................................. 348/725, 726,
348/731–733, 735; 375/316, 326, 327,
339, 344; 455/20–22, 189.1, 190.1, 191.1,
192.1, 192.2, 207–209, 255–265, 313, 316,
323, 324

[56]              References Cited

U.S. PATENT DOCUMENTS

| 3,311,832 | 3/1967 | Schrader | 455/316 |
|---|---|---|---|
| 3,544,899 | 12/1970 | Gusyatinsky et al. | 455/315 |
| 4,580,289 | 4/1986 | Enderby | 445/314 |
| 5,034,695 | 7/1991 | Owen | 329/325 |
| 5,111,162 | 5/1992 | Hietala et al. | 332/127 |
| 5,260,671 | 11/1993 | Iso et al. | 375/344 |
| 5,280,644 | 1/1994 | Vannatta et al. | 455/265 |
| 5,548,344 | 8/1996 | Park | 348/726 |
| 5,570,136 | 10/1996 | Kim | 348/725 |

*Primary Examiner*—Amanda Le
*Attorney, Agent, or Firm*—Pillsbury Madison & Sutro

[57]              ABSTRACT

A digital data receiver comprising a first frequency converter for converting a high frequency digital orthogonal modulation signal into a first intermediate frequency signal based on a first local oscillation signal, a second frequency converter for converting the first intermediate frequency signal into a second intermediate frequency signal based on a second local oscillation signal, and a demodulator for performing a orthogonal demodulation to the second intermediate frequency signal based on a third local oscillation signal, wherein the first local oscillation signal is generated by a variable oscillator for a PLL frequency synthesizer, the second local oscillation signal is generated by a high frequency oscillator in which its oscillation frequency is controlled based on the frequency control signal generated by the modulator to perform the orthogonal demodulation processing, and the third local oscillation signal is generated by a fixed oscillator in which its oscillation frequency is fixed.

6 Claims, 6 Drawing Sheets

DIGITAL DATA RECEIVER

FIELD OF THE INVENTION

The present invention relates to a digital data transmission system such as a CATV (cable television) broadcasting system, a satellite broadcasting system or an HDTV broadcasting system at a UHF band, and, more particularly to a digital data receiver which receives digital data such as picture data which are digitally transmitted.

BACKGROUND OF THE INVENTION

A conventional digital picture data receiver may be constructed as shown in FIG. 1 when used for a digital television broadcasting system such as a digital data transmission system. That is, numeral 11 in FIG. 1 denotes an input terminal to which a plurality of high frequency digital orthogonal modulation signals are processed such as QPSK (four phase shift modulation) modulation. 16 QAM (16 quadrature amplitude modulation) modulation and 64 QAM modulation.

These plurality of high frequency digital orthogonal modulation signals supplied to the input terminal 11 are amplified by a high frequency amplifier 12 and then supplied to a first mixer 13. Then the high frequency digital orthogonal modulation signals are mixed with a first local oscillation signal output from a first local oscillator 16 which comprises a first high frequency oscillator 14 and a first PLL (phase-locked loop) 15. Then the high frequency digital orthogonal modulation signals are up-converted to a first intermediate frequency signal. In this case, it is possible to choose a desirable signal among the plurality of high frequency digital orthogonal modulation signals by means of properly changing the frequency of the first local oscillation signal.

The first intermediate frequency signal output from the first mixer 13 experiences a band limitation in a first intermediate frequency BPF (band-pass filter). The first intermediate frequency signal is then amplified in a first intermediate frequency amplifier 18 and further supplied to a second mixer 19. The first intermediate frequency signal is mixed with a second local oscillation signal output from a second local oscillator 22 which is comprised of a second high frequency oscillator 20 and a second PLL 21. Thus the first intermediate frequency signal is down-converted into a second intermediate frequency signal. In this case, the frequency of the second local oscillation signal output from the second local oscillator 22 is almost fixed.

Here, the second intermediate frequency signal output from the second mixer 19 experiences a band limitation in a second intermediate frequency BPF 23, and after that the band limited second intermediate frequency signal is supplied to both of an I axis phase comparator 24 and a Q axis phase comparator 25. A pair of third local oscillation signals are supplied to the I axis phase comparator 24 and the Q axis phase comparator 25, respectively. The pair of third local oscillation signals are orthogonally related in their phases with each other.

Further the I axis phase comparator 24 and the Q axis phase comparator 25 perform a synchronous detection or a quasi-synchronous detection on the second intermediate frequency signal by comparing the phases of the second intermediate frequency signal and the third local oscillation signal, so as to demodulate the I signal and Q signal. The I signal output from the I axis phase comparator 24 and the Q signal output from the Q axis phase comparator 25 are respectively output from the output terminals 29 and 30 through the phase control signal generator 28.

The phase control signal generator 28 generates the phase control signal controlling the third local oscillation signal for the synchronous detection or the quasi-synchronous detection in the I axis phase comparator 24 and the Q axis comparator 25. The phase control signal output from the phase control signal generator 28 is supplied to the third local oscillator 26 after a conversion to the phase control voltage by a COSTAS loop LPF (low pass filter) so as to control the oscillation frequency.

Here, the first local oscillator 18 is a variable oscillator with a PLL frequency synthesizer. While the second local oscillator 22 is generally configured by a fixed oscillator with a PLL frequency synthesizer.

However, the conventional digital data receiver as described above has drawbacks. For instance, the receiver requires two systems having independent PLL frequency synthesizers. The receiver is also complicated in its construction and expensive since the receiver utilizes the PLL frequency synthesizers for the first and second local oscillators 16 and 22 as well as a highly stabilized oscillator such as a VCXO (voltage controlled crystal oscillator) for the third local oscillator 26 to secure a higher frequency stability.

SUMMARY OF THE INVENTION

The present invention has an object to remove the drawbacks in the conventional apparatus.

Another object of the present invention is to provide a digital data receiver which is less complicated and less expensive.

The digital data receiver according to the invention is provided with a first frequency convertor for converting an input high frequency digital orthogonal modulation signal into a first intermediate frequency signal based on a first local oscillation signal, a second frequency convertor for converting the first intermediate frequency signal output from the first frequency conversion means into a second intermediate frequency signal based on a second local oscillation signal, and a demodulator performing a orthogonal demodulation processing to the second intermediate frequency signal output from the second frequency convertor based on a third local oscillation signal.

In order to achieve the above objects, the above-mentioned type of digital data receiver according to one aspect of the present invention has first local oscillation signal that is generated by a variable oscillator in a PLL frequency synthesizer, a second local oscillation signal that is generated by a high frequency oscillator having an oscillation frequency that is controlled based on the frequency control signal which is generated by a modulator to perform the orthogonal demodulation processing; and a third local oscillation signal that is generated by a fixed frequency oscillator.

The above-mentioned type of digital data receiver according to another aspect of the present invention where the first local oscillation signal that is generated by a variable frequency oscillator in a PLL frequency synthesizer. Where the second local oscillation signal is generated by a high frequency oscillator having an oscillation frequency that is controlled based on the frequency control signal generated by the modulator to perform the orthogonal demodulation processing, and where the third local oscillation signal is generated by a frequency divider for dividing the second local oscillation signal output from the high frequency oscillator.

The above-mentioned type of digital data receiver according to still another aspect of the present invention where the first local oscillation signal is generated by a variable oscillator in a PLL frequency synthesizer, the third local oscillation signal is generated by a reference oscillator in which its oscillation frequency is controlled based on the frequency control signal generated by the modulator to perform the orthogonal demodulation processing, and the second local oscillation signal is generated by a frequency doubler for doubling the frequency of the third local oscillation signal output from the reference oscillator.

According to the construction as described above, since a PLL frequency synthesizer is used only in the variable oscillator to obtain the first local oscillation signal in all cases, it is able to provide a digital data receiver which is not complicated in its construction and which is not expensive.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Referring now to the attached drawings, some embodiments of the digital data receiver according to the present invention will be explained hereinafter.

Figure 1:
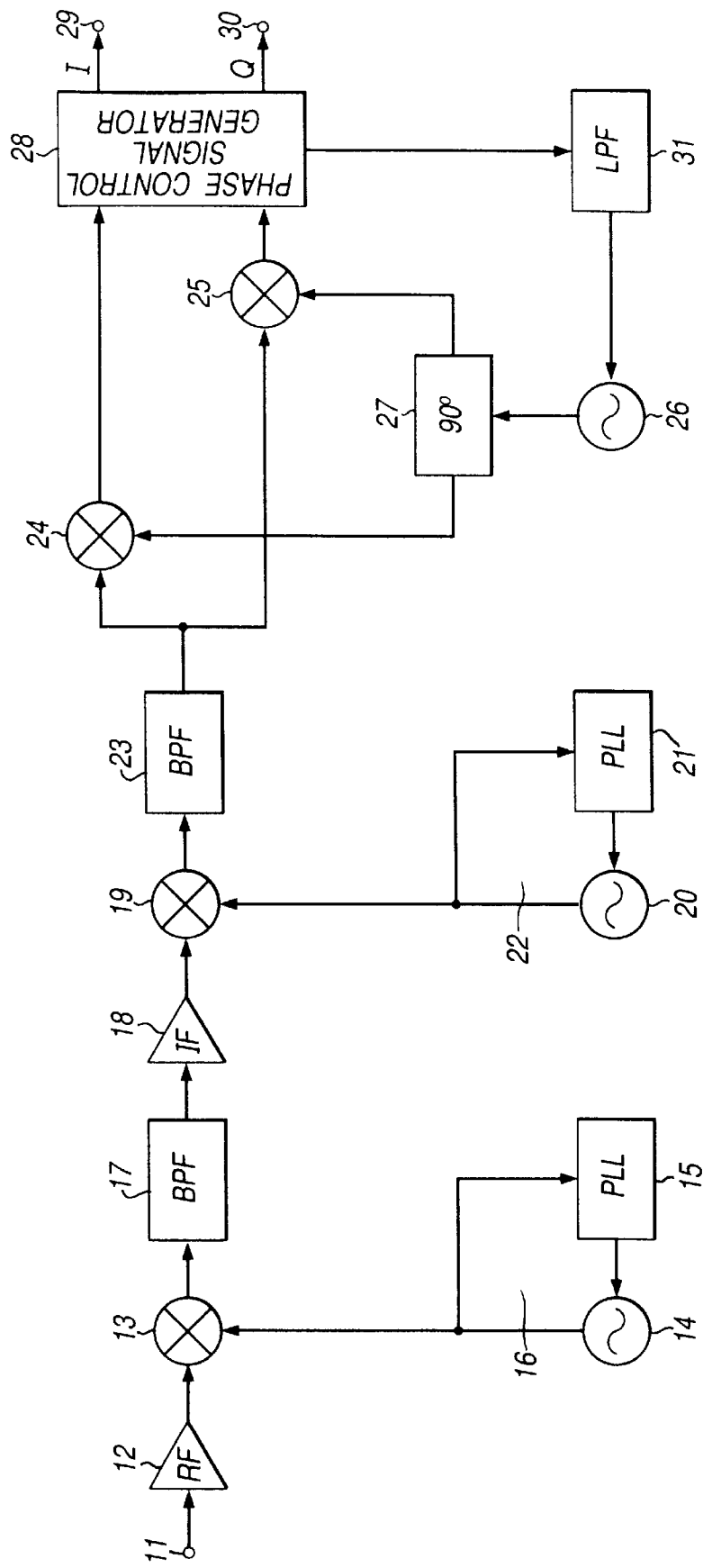
FIG. 1 is a block diagram showing a conventional digital data receiver.
Figure 2:
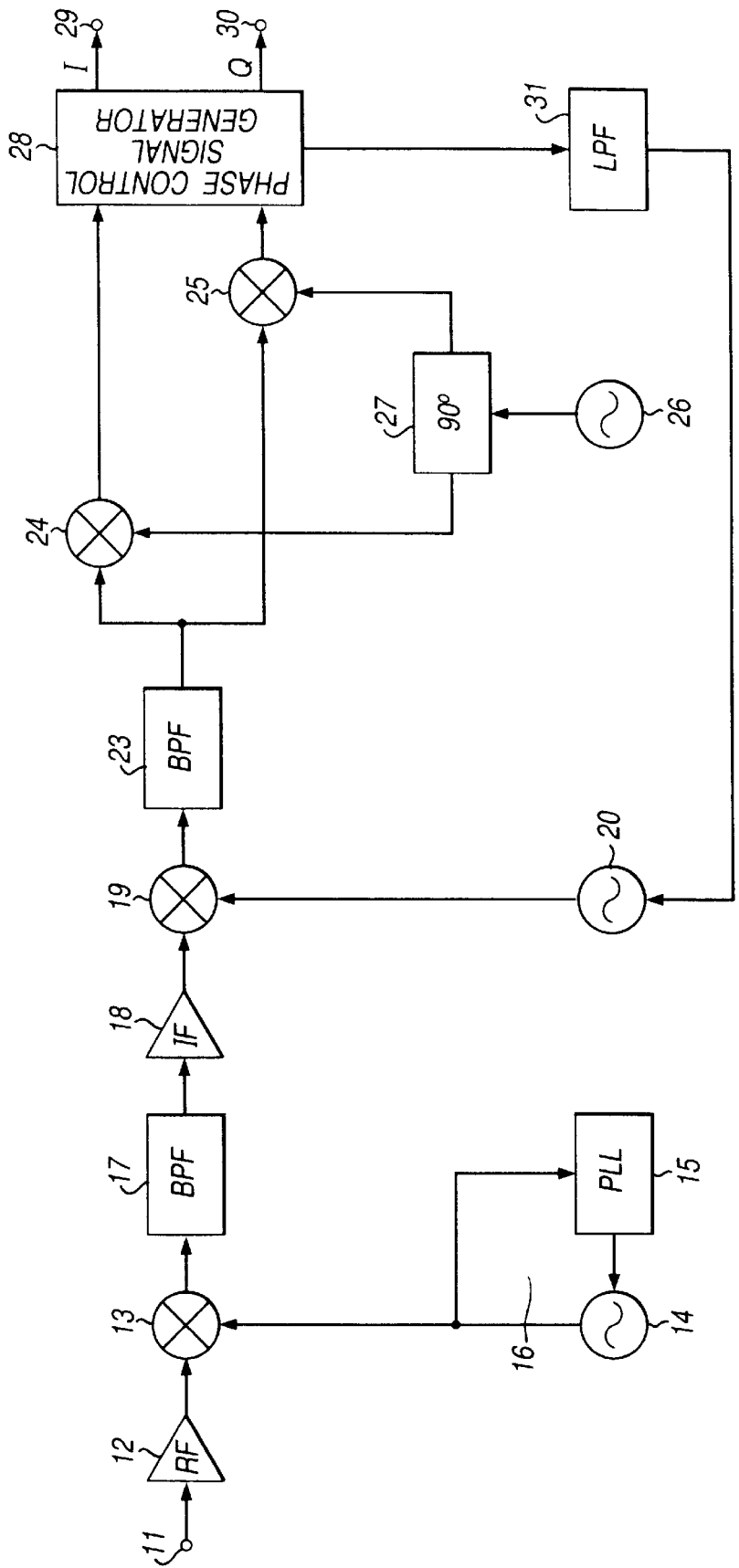
FIG. 2 is a block diagram showing one embodiment of the digital data receiver according to the present invention.

FIG. 2 illustrates a first embodiment of the present invention. In FIG. 2 the same components as those in FIG. 1 are assigned with the same reference numerals. Accordingly, the present invention is different from the conventional receiver in that the oscillation frequency of the second local oscillation signal output from the second high frequency oscillator 20 is controlled by the phase control voltage output from a COSTAS loop LPF 31, and the third local oscillator 26 is constructed by the high stable oscillator such as a VCXO or the like.

According to the construction as described above, frequency errors of the I signal and the Q signal generated from the first local oscillator 16 and the third local oscillator 26 are corrected by the second local oscillation signal generated from the second high frequency oscillator 20 which is controlled by the phase controlling voltage output from the COSTAS loop LPF 31. According to the construction of the above mentioned embodiment, the PLL frequency synthesizer is used for only the first local oscillator 16. Since the present invention needs only one of the PLL frequency synthesizer, the present invention can provide the digital data receiver which is not sophisticated in its construction and not terribly expensive.

Figure 3:
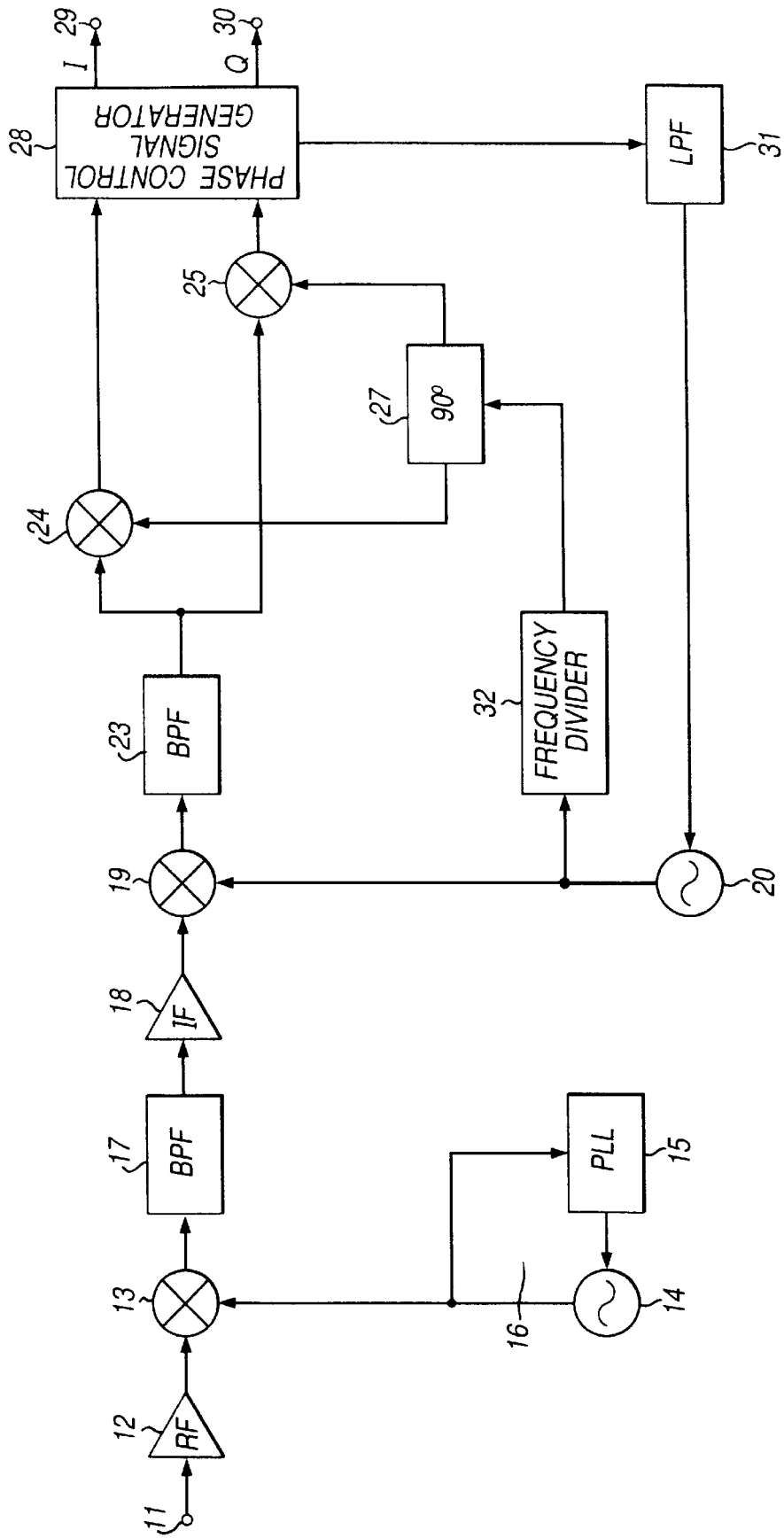
FIG. 3 is a block diagram showing a second embodiment of the present invention.

Referring now to FIG. 3, a second embodiment of the present invention will be described. When in FIG. 3 the same components as those in FIG. 2 are assigned with the same reference numerals. In this embodiment the third local oscillator 26 of the first embodiment is deleted. To replace the output from the third oscillator, the second local oscillation signal output from the second high frequency oscillator 20 is used as an oscillation signal for the 90° phase shifter 27 by being divided in a frequency divider 32. According to the construction of the second embodiment, since the PLL frequency synthesizer is used only in the first local oscillator 16, the present invention can provide the digital data receiver which is not sophisticated in its construction and not expensive.

Figure 4:
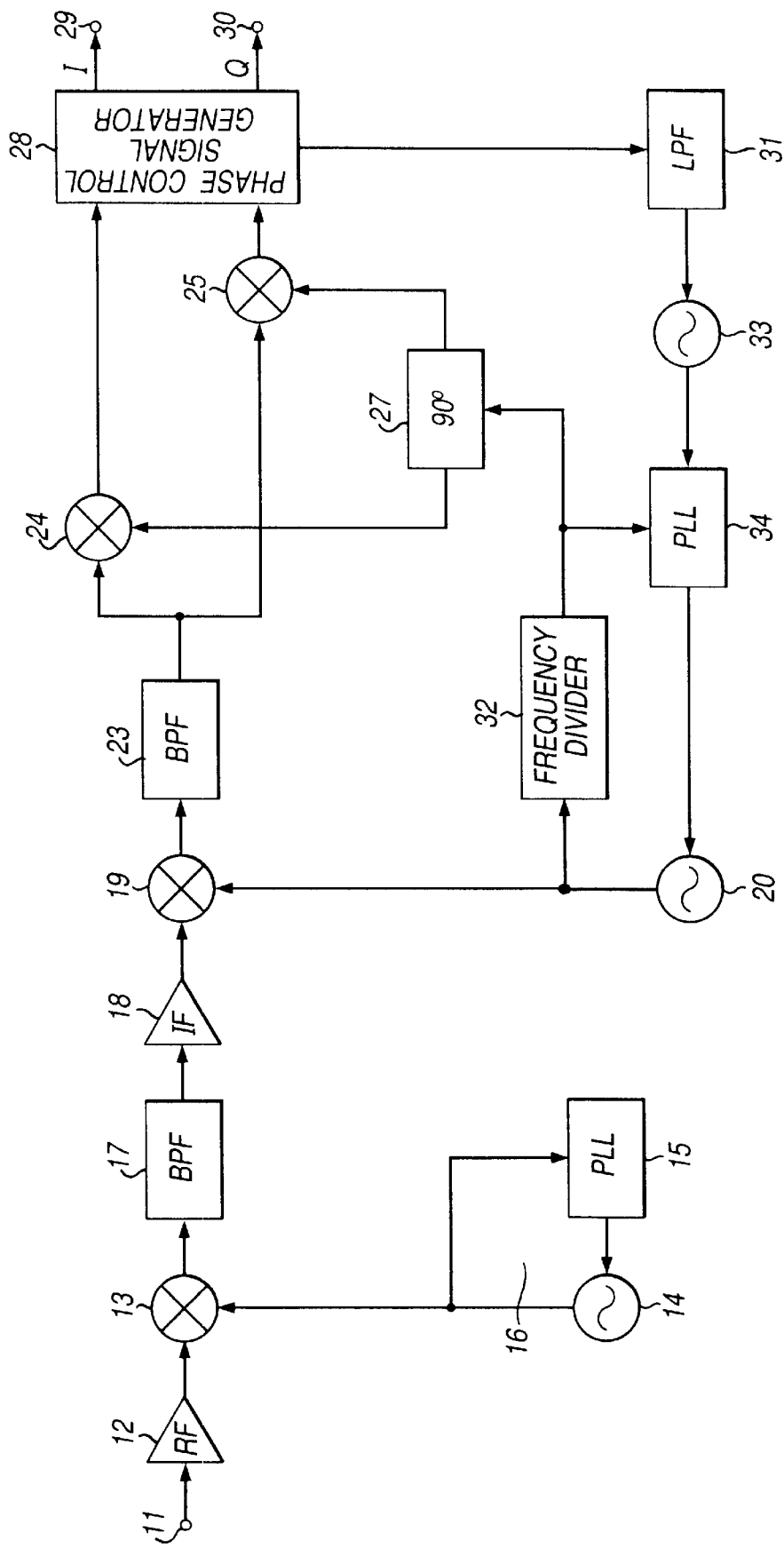
FIG. 4 is a block diagram showing a modification of the second embodiment.

FIG. 4 shows a modification of the second embodiment shown in FIG. 3. When in FIG. 4 the same components as those in FIG. 3 are assigned with the same reference numerals, the phase controlling voltage output from the COSTAS loop LPF 31 is used for controlling the oscillation frequency of the reference oscillator 33 constructed by a VCXO etc. Then the oscillation signal of the reference oscillator 33 and the divided output from the frequency divider 32 drive the PLL 34. Thus the output of the PLL 34 controls the oscillation frequency of the second high frequency oscillator 20.

That is, the phase control voltage output from the COSTAS loop LPF 31 is not directly returned to the second high frequency oscillator 20 in which its oscillation frequency is apt to become unstable but returned to the reference oscillator 33 constructed using a VCXO. The frequency of the second local oscillation signal is therefore stabilized, since the oscillation frequency of the second high frequency oscillator 20 is controlled by the output of the PLL 34 which is driven by the oscillation signal of the reference oscillator 33 and the output of the frequency divider 32.

Figure 5:
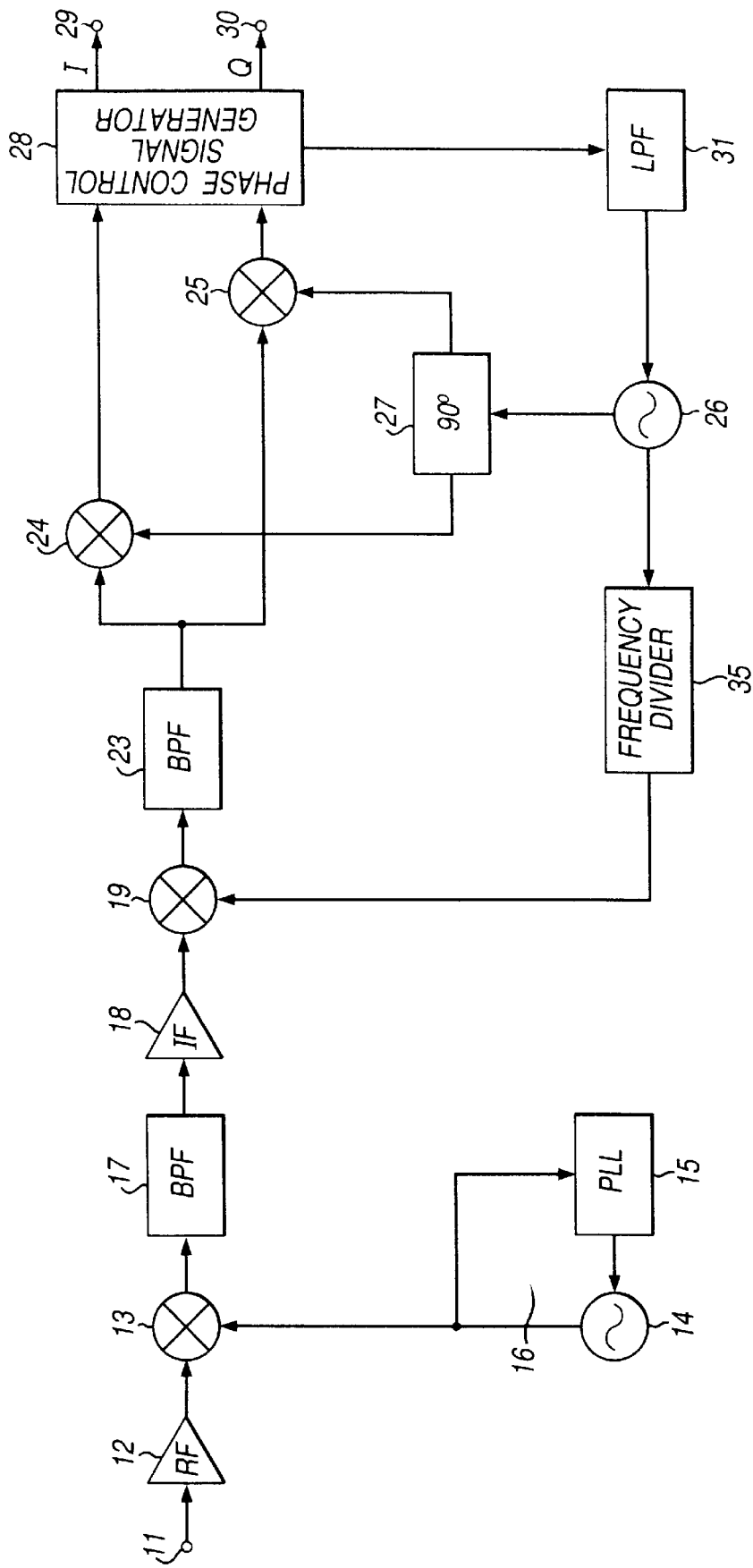
FIG. 5 is a block diagram showing a third embodiment of the present invention.

Referring now to FIG. 5, a third embodiment of the present invention will be described. In FIG. 5 the same components as those shown in FIG. 1 are assigned with the same reference numerals. Accordingly the third embodiment is different from the second embodiment in that a frequency doubled signal of the oscillation signal of the third local oscillator 26 by the frequency doubler 35 is supplied to the second mixer 19 as a second local oscillation signal. According to the construction as described above, since a PLL frequency synthesizer is used only in the first local oscillator 16, the present invention can provide the digital data receiver which is not sophisticated in its construction and not expensive.

Figure 6:
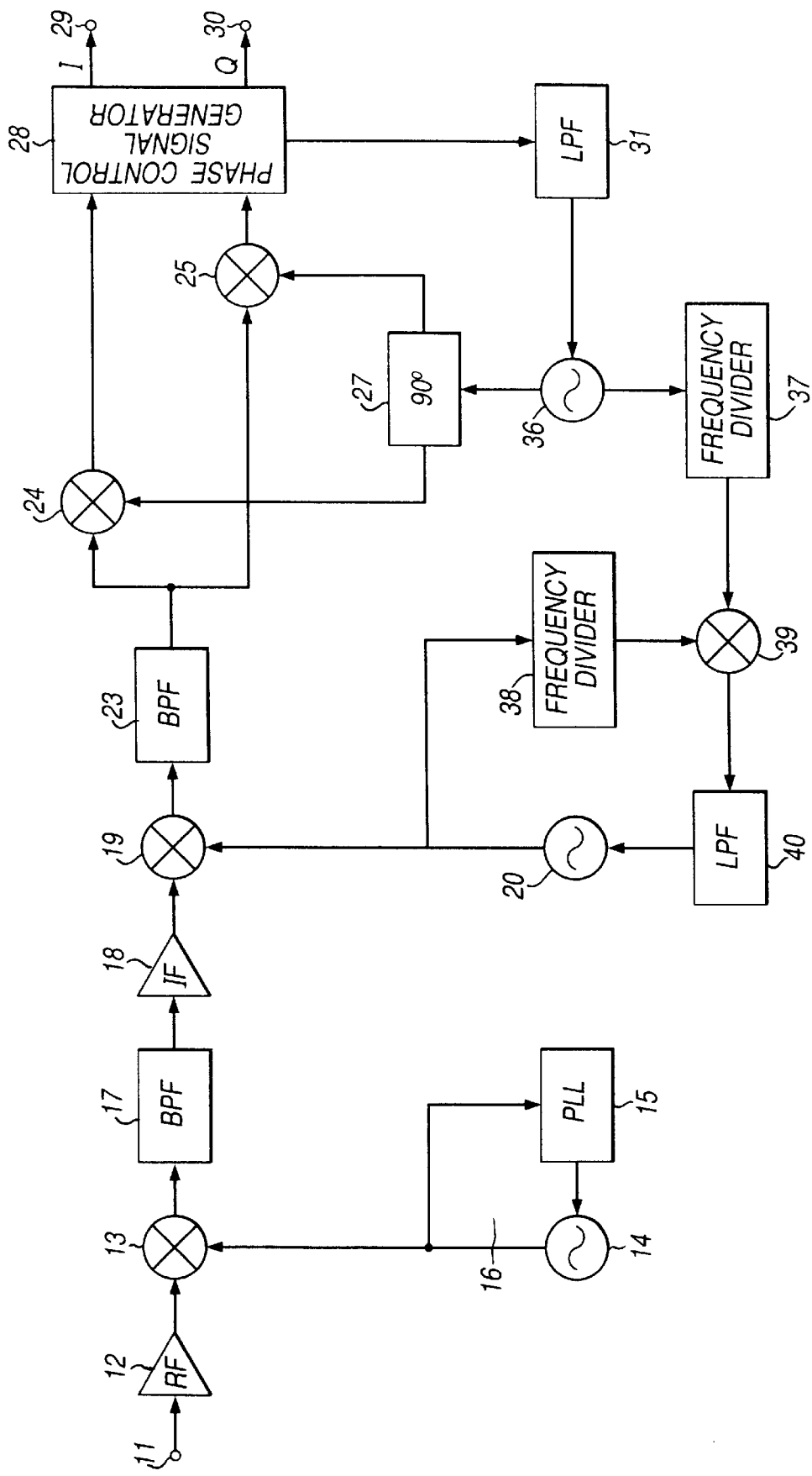
FIG. 6 is a block diagram showing the modification of the third embodiment.

FIG. 6 shows a modification of the third embodiment shown in FIG. 5. When in FIG. 6 the same components as those shown in FIG. 5 are assigned with the same reference numerals, the oscillation frequency in the reference oscillator 36 constructed in using a VCXO is controlled by the phase controlling voltage output from the COSTAS loop LPF 31. Then, the frequency divided signal of the oscillation signal from the reference oscillator 36 constructed in using a VCXO etc. by the frequency divider 37 and the other frequency divided signal of the oscillation signal from the second high frequency oscillator 20 by the frequency divider 38 are compared in their phases. As a result, the phase comparing result is converted in the voltage fashion for controlling the oscillation frequency of the second high frequency oscillator 20.

In the third embodiment, also, the phase control voltage output from the COSTAS loop LPF 31 is not directly returned to the second high frequency oscillator 20 in which its oscillation frequency is apt to become unstable. The phase control voltage output from loop 31 is instead returned to the reference oscillator 36 constructed using a VCXO. The frequency of the second local oscillation signal is stabilized, since the oscillation frequency of the second high frequency oscillator 20 is controlled by the phase comparing result between the frequency divided signal of the oscillation signal from the reference oscillator 36 constructed in using a VCXO etc. by the frequency divider 37 and the other frequency divided signal of the oscillation signal from the second high frequency oscillator 20 by the frequency divider 38.

The present invention is not limited to the above mentioned embodiments, and can be adapted for many applications without departing from the principle of the present invention.

As described above, the present invention can provide an extremely preferable digital data receiver.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a divisional application.

What is claimed is:

1. A digital data receiver comprising:
    first frequency conversion means for converting an input high frequency digital orthogonal modulation signal into a first intermediate frequency signal based on a first local oscillation signal;
    second frequency conversion means for converting the first intermediate frequency signal output from the first frequency conversion means into a second intermediate frequency signal based on a second local oscillation signal;
    demodulation means performing orthogonal demodulation processing upon the second intermediate frequency signal output from the second frequency conversion means based on a third local oscillation signal;
    variable oscillation means for generating the first local oscillation signal, the variable oscillation means including a PLL frequency synthesizer;
    high frequency oscillation means for generating the second local oscillation signal, the oscillation frequency of the high frequency oscillation means being controlled based on a frequency control signal which is generated by the demodulation means; and
    fixed frequency oscillation means for generating the third local oscillation signal with a fixed frequency.

2. A digital data receiver as claimed in claim 1, wherein the demodulation means outputs an I-signal component and a Q-signal component separately.

3. A digital data receiver comprising:
    first frequency conversion means for converting an input high frequency digital orthogonal modulation signal into a first intermediate frequency signal based on a first local oscillation signal;
    second frequency conversion means for converting the first intermediate frequency signal output from the first frequency conversion means into a second intermediate frequency signal based on a second local oscillation signal;
    demodulation means performing orthogonal demodulation processing upon the second intermediate frequency signal output from the second frequency conversion means based on a third local oscillation signal;
    variable frequency oscillation means for generating the first local oscillation signal, the variable oscillation means including a PLL frequency synthesizer;
    high frequency oscillation means for generating the second local oscillation signal, the oscillation frequency of the high frequency oscillation means being controlled based on a frequency control signal which generated by the demodulation means; and
    frequency dividing means for generating the third local oscillation signal by dividing the second local oscillation signal output from the high frequency oscillation means.

4. A digital data receiver comprising:
    first frequency conversion means for converting an input high frequency digital orthogonal modulation signal into a first intermediate frequency signal based on a first local oscillation signal;
    second frequency conversion means for converting the first intermediate frequency signal output from the first frequency conversion means into a second intermediate frequency signal based on a second local oscillation signal;
    demodulation means performing orthogonal demodulation processing upon the second intermediate frequency signal output from the second frequency conversion means based on a third local oscillation signal;
    variable frequency oscillation means for generating the first local oscillation signal, the variable oscillation means including a PLL frequency synthesizer;
    high frequency oscillation means for generating the second local oscillation signal, the oscillation frequency of the high frequency oscillation means being controlled based on a frequency control signal which generated by the demodulation means; and
    frequency dividing means for generating the third local oscillation signal by dividing the second local oscillation signal output from the high frequency oscillation means, wherein the high frequency oscillation means comprises a reference oscillator having an oscillation frequency that is controlled based on the frequency control signal generated by the demodulation means and a high frequency oscillator with a PLL frequency synthesizer driven based on the outputs of the reference oscillator and of the frequency dividing means.

5. A digital data receiver comprising:

first frequency conversion means for converting an input high frequency digital orthogonal modulation signal into a first intermediate frequency signal based on a first local oscillation signal;

second frequency conversion means for converting the first intermediate frequency signal output from the first frequency conversion means into a second intermediate frequency signal based on a second local oscillation signal;

demodulation means performing orthogonal demodulation processing upon the second intermediate frequency signal output from the second frequency conversion means based on a third local oscillation signal;

variable oscillation means for generating the first local oscillation signal, the variable oscillation means including a PLL frequency synthesizer;

reference oscillation means for generating the third local oscillation signal, the oscillation frequency of the reference oscillation means being controlled based on the frequency control signal generated by the demodulation means; and frequency doubler means for generating the second local oscillation signal by doubling the frequency of the third local oscillation signal output from the reference oscillation means.

6. A digital data receiver as claimed in claim 5, wherein the frequency doubler means comprises a high frequency oscillator driven based on the output of the reference oscillation means.

* * * * *